(12) United States Patent  
Shirotori

(10) Patent No.: US 7,418,614 B2  
(45) Date of Patent: Aug. 26, 2008

(54) EXTERNAL SIGNAL DETECTION CIRCUIT AND REAL-TIME CLOCK

(75) Inventor: Toru Shirotori, Minamiminowa-mura (JP)

(73) Assignee: Seiko Epson Corporation, Tokyo (JP)

( * ) Notice: Subject to any disclaimer, the term of this patent is extended or adjusted under 35 U.S.C. 154(b) by 14 days.

(21) Appl. No.: 11/428,602

(22) Filed: Jul. 5, 2006

(65) Prior Publication Data

US 2007/0029980 A1 Feb. 8, 2007

(30) Foreign Application Priority Data

Jul. 25, 2005 (JP) ............................. 2005-214095

(51) Int. Cl.
*G06F 1/00* (2006.01)
*G06F 1/26* (2006.01)
*H03B 1/00* (2006.01)
*H03L 7/099* (2006.01)

(52) U.S. Cl. ..................... 713/500; 713/300; 713/320; 331/65; 331/74; 331/185

(58) Field of Classification Search .................. 713/500
See application file for complete search history.

(56) References Cited

U.S. PATENT DOCUMENTS 6,958,953 B2 * 10/2005 Retter et al. ................... 368/47
2005/0268127 A1 * 12/2005 Shiba et al. ................. 713/320

FOREIGN PATENT DOCUMENTS

JP A 7-325780 12/1995

* cited by examiner

*Primary Examiner*—Rehana Perveen
*Assistant Examiner*—Stefan Stoynov
(74) *Attorney, Agent, or Firm*—Oliff & Berridge, PLC

(57) ABSTRACT

An external signal detection circuit includes an input port, to which a first end of a circuit including a pull-up resistor connected in series with a first switch portion is connected, the input port receiving an input of an external signal; an input detection portion connected to the input port for receiving an input of the external signal and an input of an input detection signal that sets a timing for intermittently detecting the input of the external signal; and a connection control portion turning on the first switch portion in time with the timing at which the external signal is detected.

7 Claims, 4 Drawing Sheets

EXTERNAL SIGNAL DETECTION CIRCUIT AND REAL-TIME CLOCK

BACKGROUND OF THE INVENTION

1. Technical Field

The present invention relates to an external signal detection circuit and a real-time clock.

2. Related Art

A real-time clock is a piezoelectric device that creates digital data, including that indicating time-of-day, date, and the like, from a clock signal. Some of such a real-time clock include an input port of an external signal, in which a signal from an external environment (an external signal) is inputted so that the external signal can be supplied to a central processing unit (CPU), an arithmetic circuit, or the like. The real-time clock herein corresponds to an electronic apparatus mounted with a real-time clock, the electronic device operating in negative logic or positive logic, as the case may be, with a pull-up resistor or a pull-down resistor connected to the input port.

FIG. 3 is diagram illustrating a pull-up resistor and a pull-down resistor connected to an input port. A pull-up resistor 3 is connected to an input port 1 via a first switch portion 2 and a pull-down resistor 5 is connected to the input port 1 via a second switch portion 4. Further, an external circuit 6 is connected to the input port 1. When the first switch portion 2 connected in series with the pull-up resistor 3 is turned on (closed), current flows from a power source Vdd to the external circuit 6 via the input port 1 as shown by an arrow B of FIG. 3. If the first switch portion 2 is kept on, the current continues flowing to consume an electric power.

JP-A-7-325780 is an example of related art. JP-A-7-325780 discloses an arrangement, in which an input/output port of a microprocessor includes an output mode setting MOS transistor connected to a power source, and an operation switch is interposed between an input/output pin and the power source. A CPU reads a switching program from a program memory to control operations of the output mode setting MOS transistor and to operate the operation switch. A leak current is thereby prevented from flowing to suppress power consumption.

If an electronic apparatus is formed by connecting the pull-up resistor 3 and the pull-down resistor 5 to the input port 1 and further connecting the input port 1 to the external circuit 6, and if the pull-up resistor 3 is kept connected to the input port 1, current continues flowing as shown by the arrow B in FIG. 3, resulting in wasteful consumption of power, as described above. Should the electronic apparatus mounted with a real-time clock operate on a battery, the battery would have a shorter service life. An example of a condition, in which such a wasteful current flows, includes an electronic apparatus constituting a switch for a remote control or the like, the switch being kept on for an unnecessarily long period of time.

To prevent the wasteful current shown by the arrow B in FIG. 3 from flowing, it is possible to provide an on/off control of the switch connected in series with the pull-up resistor 3 or the pull-down resistor 5, thereby restricting connection of the pull-up resistor 3 to the input port 1 and thus restricting connection of the power source Vdd to the external circuit 6. If this restricting operation is controlled by a central processing unit (CPU) by using software or an external circuit, load is imposed on the software and the like. Specifically, this results in increased occupancy of CPU resources. As a result, system performance is impaired and power consumption of the CPU itself increases.

Further, the following problem arises when the external signal inputted to the input port 1 is to be detected. FIGS. 4A and 4B are views for illustrating a case, in which the external circuit has a line capacity. Herein, FIG. 4A is a circuit block diagram and FIG. 4B is a diagram showing a relation between time and an input port voltage. A case is to be herein considered, in which the first switch portion 2 is connected in series with the pull-up resistor 3 and the first switch portion 2 is controlled to be turned on or off so as to restrict connection of the pull-up resistor 3 to the input port 1, and so as to detect a HIGH signal (external signal) inputted to the input port 1. If the external circuit 6 connected to the input port 1 has a large line capacity, connecting the pull-up resistor 3 to the input port 1 by turning on the first switch portion 2 immediately before an input detection timing causes a voltage level at the input port 1 (input port voltage) to build up gradually. Specifically, it takes time for the voltage to build up, or the voltage at the input port 1 does not go HIGH immediately. Accordingly, the voltage does not build up sufficiently at a timing (input detection timing) at which it is determined whether or not the external signal has been inputted to the input port 1. The related art technique therefore involves a problem in that the voltage at the input port 1 is lower than a H/L threshold established for determining if the voltage is a HIGH or LOW level, resulting in an erroneous detection of a LOW level.

SUMMARY

An advantage of some aspects of the invention is to provide an external signal detection circuit and a real-time clock that promote lower power consumption, lessen load on a CPU, and allow external signal detection timing and resistor connection timing to be adjusted with high accuracy.

An external signal detection circuit according to one aspect of the invention includes an input port, an input detection portion, and a connection control portion. Specifically, the input port is connected to a first end of a circuit that has a pull-up resistor connected in series with a first switch portion. The input port receives an input of an external signal. The input detection portion is connected to the input port for receiving an input of the external signal. The input detection portion also receives an input of an input detection signal that sets timing for intermittently detecting the input of the external signal (detection timing). The connection control portion turns on (closes) the first switch portion in time with the timing at which the external signal is detected. The first switch portion is turned on to connect the pull-up resistor to the input port according to the timing at which the external signal is detected. The pull-up resistor and the input port are not therefore connected to each other at any time that falls outside a range of the detection timing of the external signal. Accordingly, a power source connected to the pull-up resistor is connected to the input port only at a time that corresponds to a range of the detection timing of the external signal. This prevents wasteful current from flowing to the input port from the power source at any time outside the range corresponding to the detection timing. Consumption of electric power can thereby be reduced.

It is preferable that the connection control portion include a counter portion and an arithmetic portion. Specifically, the counter portion receives an input of the input detection signal and a control clock signal that is in synchronism with the input detection signal. The counter portion thereby sets a connection time of the first switch portion. The arithmetic portion is connected to the counter portion. The arithmetic portion calculates a signal outputted from the counter portion and outputs a result of calculation to the first switch portion.

Detection of an input of the external signal is made based on the input detection signal. Since the control clock signal is in synchronism with the input detection signal, the connection control portion that receives the input of the input detection signal and the control clock signal can set, in its counter portion, the connection time of the first switch portion that is in synchronism with the input detection signal. Accordingly, the connection control signal outputted from the arithmetic portion can also be made to be in synchronism with the input detection signal. Consequently, the external signal detection circuit can control the timing at which the first switch portion is turned on with high accuracy relative to the timing at which the external signal is detected. There is no chance that these timings will be deviated from each other. In addition, on/off of the first switch portion is set by the counter portion and the arithmetic portion disposed in the connection control portion. This helps prevent a processing device that controls the external signal detection circuit from being loaded. Electric power consumed by the processing device can also be reduced.

An external signal detection circuit according to another aspect of the invention includes an input port, a register setting portion, and a connection control portion. Specifically, the input port is connected to a first end of a circuit (a pull-up circuit) that has a pull-up resistor connected in series with a first switch portion and a first end of a circuit (a pull-down circuit) that has a pull-down resistor connected in series with a second switch portion. The input port receives an input of an external signal. The register setting portion is connected to the first switch portion and the second switch portion. The register setting portion selects either one of the first and second switch portions. The connection control portion is connected to the first switch portion and the second switch portion. The connection control portion controls a connection time of either the first switch portion or the second switch portion, whichever is selected by the register setting portion based on an input detection signal that detects an input of the external signal to the input port and a control clock signal that is in synchronism with the input detection signal.

The first switch portion or the second switch portion is turned on to thereby connect the pull-up resistor or the pull-down resistor to the input port at timing, at which the external signal is detected. Accordingly, the pull-up resistor or the pull-down resistor is not connected to the input port at any time other than the detection timing of the external signal. When the pull-up resistor is to be connected to the input port, therefore, a power source connected to the pull-up resistor is connected to the input port only at a time that corresponds to the detection timing of the external signal. This prevents wasteful current from flowing to the input port from the power source at any time other than the detection timing. Consumption of electric power can thereby be reduced. In addition, the external signal detection circuit can set, in its connection control portion, the connection time of the first switch portion or the second switch portion that is in synchronism with the input detection signal.

It is preferable that the connection control portion include a setup time counter, a release time counter, and an arithmetic portion. Specifically, the setup time counter receives an input of the input detection signal and the control clock signal and thereby sets a connection time before a detection timing established based on the input detection signal. The release time counter receives an input of the input detection signal and the control clock signal and thereby sets a connection time after the detection timing. The arithmetic portion is connected to the setup time counter and the release time counter. The arithmetic portion calculates signals outputted from the setup and release time counters and outputs a result of calculation to the first or second switch portion so that the switch portion is connected in time with the detection timing. The input detection signal sets the detection timing of the external signal. Since the input detection signal and the control clock signal inputted in the setup time counter and the release time counter are in synchronism with each other, each of the signals outputted from the setup and release time counters is also in synchronism with the input detection signal. Further, the signal outputted from the arithmetic portion is also in synchronism with the input detection signal. Consequently, the connection control portion can set the connection time, during which the first switch portion or the second switch portion is turned on in time with the detection timing of the external signal.

It is also preferable that the external signal detection circuit further include an input port detection sync selector and a resistor control sync selector. Specifically, the input port detection sync selector produces an output of the input detection signal based on an oscillation signal at a predetermined frequency. The resistor control sync selector produces the control clock signal based on the oscillation signal. The oscillation signals inputted to the input port detection sync selector and the resistor control sync selector, respectively, are in synchronism with each other. Accordingly, the timing at which the pull-up resistor or the pull-down resistor is connected can be made to be in synchronism with the detection timing of the external signal with high accuracy.

A real-time clock according to still another aspect of the invention includes the above-referenced external signal detection circuit and a timing signal output portion. Specifically, the timing signal output portion produces an output of a timing clock signal. These arrangements allow the real-time clock to be mounted with an external signal detection circuit having the arrangements as described above.

In this case, the timing signal output portion may include an oscillator portion and a divider portion that produces an output of the oscillation signal by dividing a source oscillation outputted from the oscillator portion. This allows the real-time clock to provide on/off control of the switch portion based on the oscillation signal at any arbitrary frequency. The real-time clock may produce an output of a plurality of oscillation signals to the external signal detection circuit. The plurality of oscillation signals are, however, based on the source oscillation outputted from a single oscillator portion. The real-time clock can therefore highly accurately synchronize the detection of the external signal with the connection of the switch portion.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
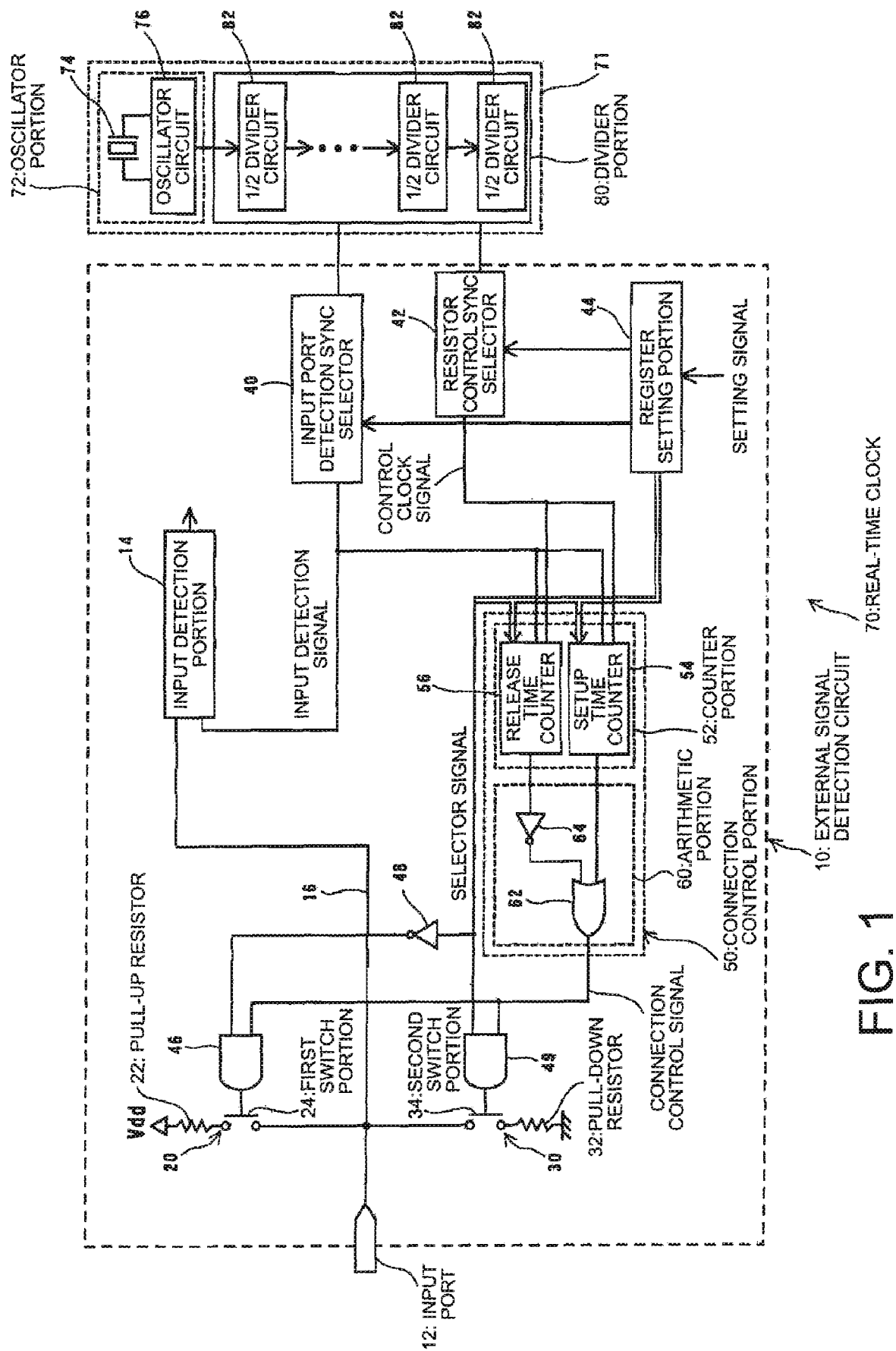
FIG. 1 is a block diagram of a principal part of a real-time clock including an external signal detection circuit.

An external signal detection circuit and a real-time clock according to an embodiment of the invention will be described below. According to the embodiment of the invention, an exemplary embodiment will be described in which the external signal detection circuit is mounted in the real-time clock. FIG. 1 is a block diagram of a principal part of a real-time clock including an external signal detection circuit. An external signal detection circuit 10 includes an input port 12, to which an external signal is inputted. A signal line 16 for guiding the external signal to an input detection portion 14 is connected to the input port 12. An input to the input detection portion 14 is also connected to an input port detection sync selector 40. An input detection signal detecting an input of an external signal to the input detection portion 14 is inputted to the input port detection sync selector 40. The input detection portion 14 may be formed, for example, from a flip-flop circuit.

A pull-up circuit 20 and a pull-down circuit 30 are connected to the signal line 16. The pull-up circuit 20 includes a pull-up resistor 22 and a first switch portion 24 connected in series with each other. The pull-up circuit 20 has a proximal end connected to the signal line 16 and a distal end connected to a power source Vdd. The pull-down circuit 30 includes a pull-down resistor 32 and a second switch portion 34 connected in series with each other. The pull-down circuit 30 has a proximal end connected to the signal line 16 and a distal end connected to a ground. The first switch portion 24 and the second switch portion 34 are connected to a register setting portion 44 that selectively controls to turn on either the first switch portion 24 or the second switch portion 34. The first switch portion 24 and the second switch portion 34 are also connected to a connection control portion 50. The connection control portion 50 controls a connection time (on time) of the switch portion 24 or 34 selected by the register setting portion 44 based on the input detection signal and a control clock signal that is in synchronism with therewith. The connection control portion 50 is connected to an input port detection sync selector 40, a resistor control sync selector 42, and the register setting portion 44. Specifically, the input port detection sync selector 40 produces an output of an input detection signal. The resistor control sync selector 42 produces an output of a control clock signal that is in synchronism with the input detection signal.

The external signal detection circuit 10 will be described in detail. Specifically, the first switch portion 24 connected in series with the pull-up resistor 22 is connected to an output of a first AND circuit 46. The register setting portion 44 is connected to a first input of the first AND circuit 46 via a first inverter 48. The connection control portion 50 is connected to a second input of the first AND circuit 46. The second switch portion 34 connected in series with the pull-down resistor 32 is connected to an output of a second AND circuit 49. The register setting portion 44 is connected to a first input of the second AND circuit 49. The connection control portion 50 is connected to a second input of the second AND circuit 49.

The connection control portion 50 includes an arithmetic portion 60 and a counter portion 52. The counter portion 52 includes a setup time counter 54 and a release time counter 56. The counter portion 52, receiving inputs of the input detection signal and the control clock signal, sets the connection time of the first switch portion 24 or the second switch portion 34, whichever is selected by the register setting portion 44. More specifically, the setup time counter 54 constituting the counter portion 52, receiving inputs of the input detection signal and the control clock signal, sets a connection time before a detection timing based on the input detection signal. The release time counter 56, receiving inputs of the input detection signal and the control clock signal, sets a connection time after the detection timing. It is to be noted that the setup time counter 54 and the release time counter 56 are preset counters that produce an output of an overflow signal when a preset count is reached.

The arithmetic portion 60 is connected to an output side of the counter portion 52. To connect the first switch portion 24 or the second switch portion 34 according to the detection timing, the arithmetic portion 60 calculates a signal outputted from the counter portion 52 and produces an output of results of calculation to each of the switch portions 24, 34. More specifically, the arithmetic portion 60 includes an OR circuit 62. A first input of the OR circuit 62 is connected to the release time counter 56 via a second inverter 64. A second input of the OR circuit 62 is connected to the setup time counter 54.

The external signal detection circuit 10 configured as described above is mounted to a real-time clock 70 such that a timing signal output portion 71 is connected to an input side of the external signal detection circuit 10, The timing signal output portion 71, which includes an oscillator portion 72 and a divider portion 80, produces an output of a timing clock signal. The oscillator portion 72 produces an output of a source oscillation. The oscillator portion 72 includes an oscillator circuit 76 connected to a piezoelectric device 74. It should be noted that the oscillator portion 72 is capable of producing an output of, for example, a source oscillation of 32.768 kHz through excitation of the piezoelectric device 74. The divider portion 80 includes a ½ divider circuit 82 connected to the oscillator circuit 76 in multiple stages. Having this ½ divider circuit 82, the divider portion 80 is capable of producing an output of an oscillation signal by diving the source oscillation. A 1-Hz oscillation signal (timing clock signal) is thereby eventually obtained. This results in a synchronized oscillation signal being inputted to each of the input port detection sync selector 40 and the resistor control sync selector 42 of the external signal detection circuit 10.

Figure 2:
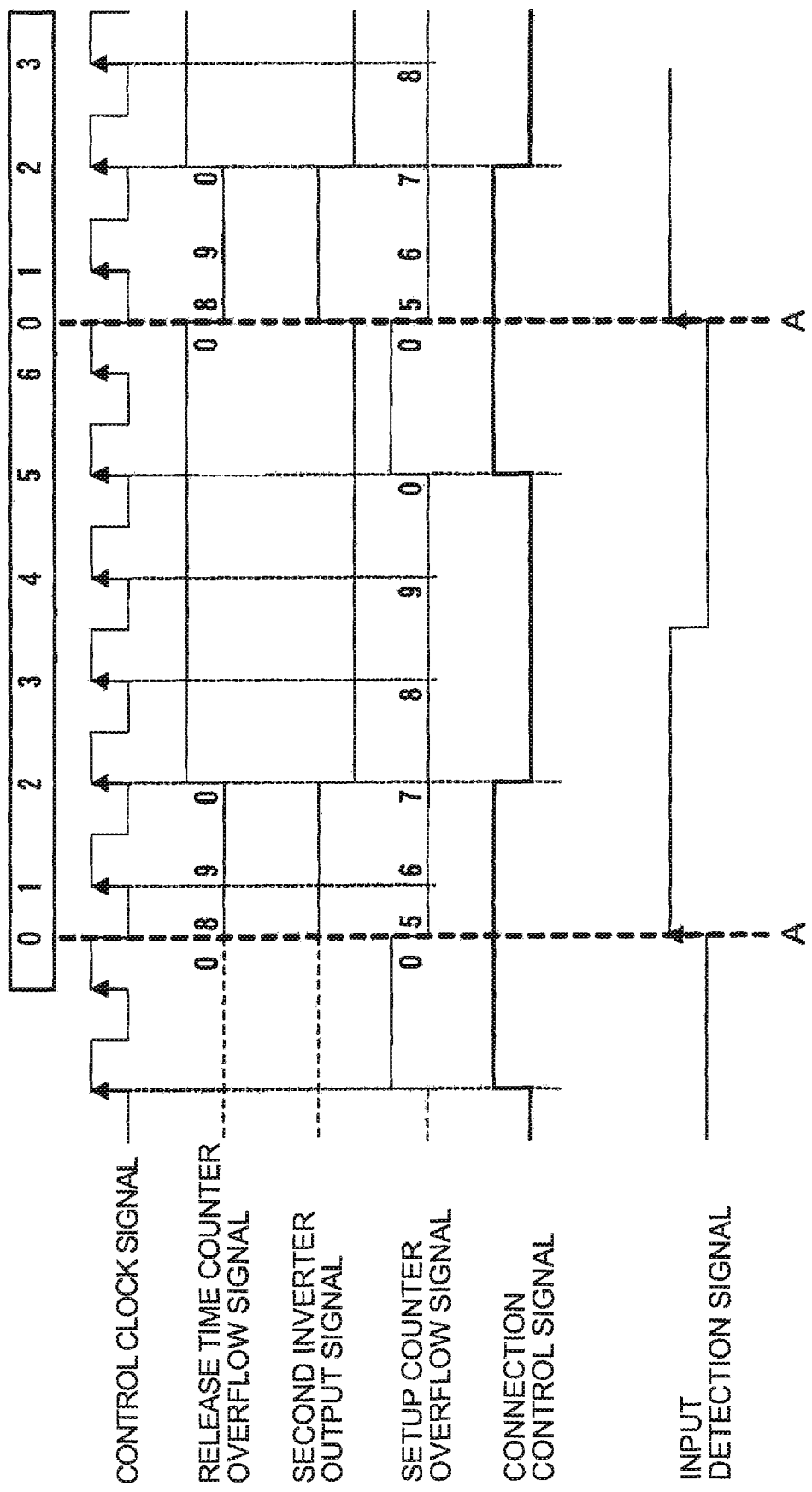
FIG. 2 is a typical operation timing chart.
Figure 3:
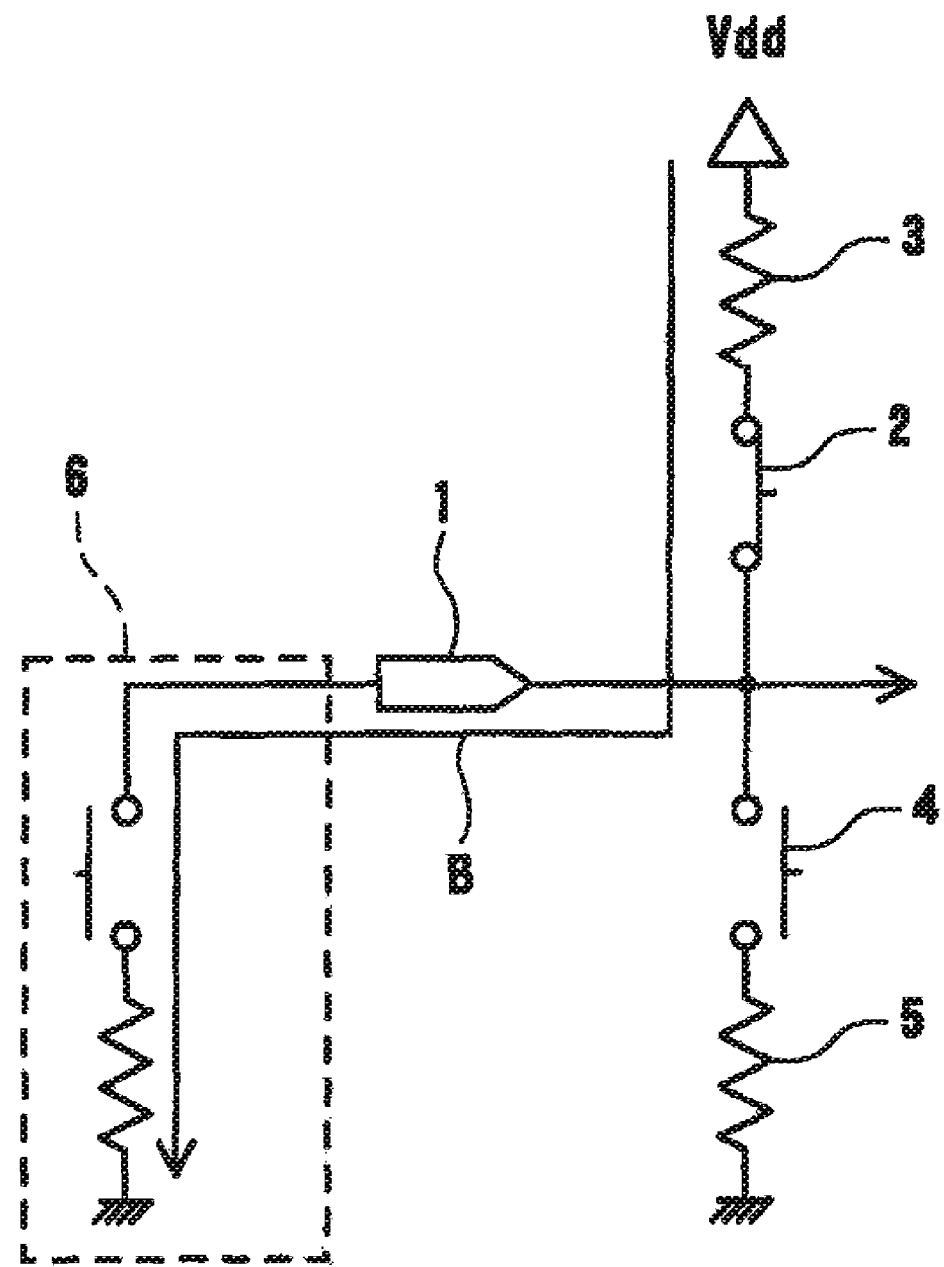
FIG. 3 is a view for illustrating a circuit, in which a pull-up resistor and a pull-down resistor are connected to an input port.
Figure 4A:
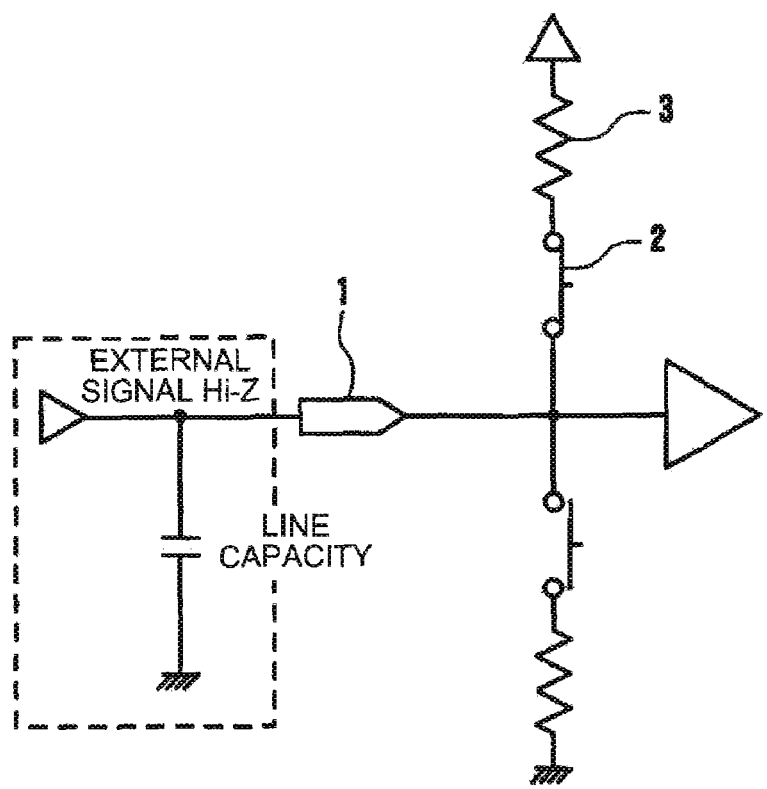
FIGS. 4A and 4B are views for illustrating a case, in which an external circuit has a line capacity.
Figure 4B:
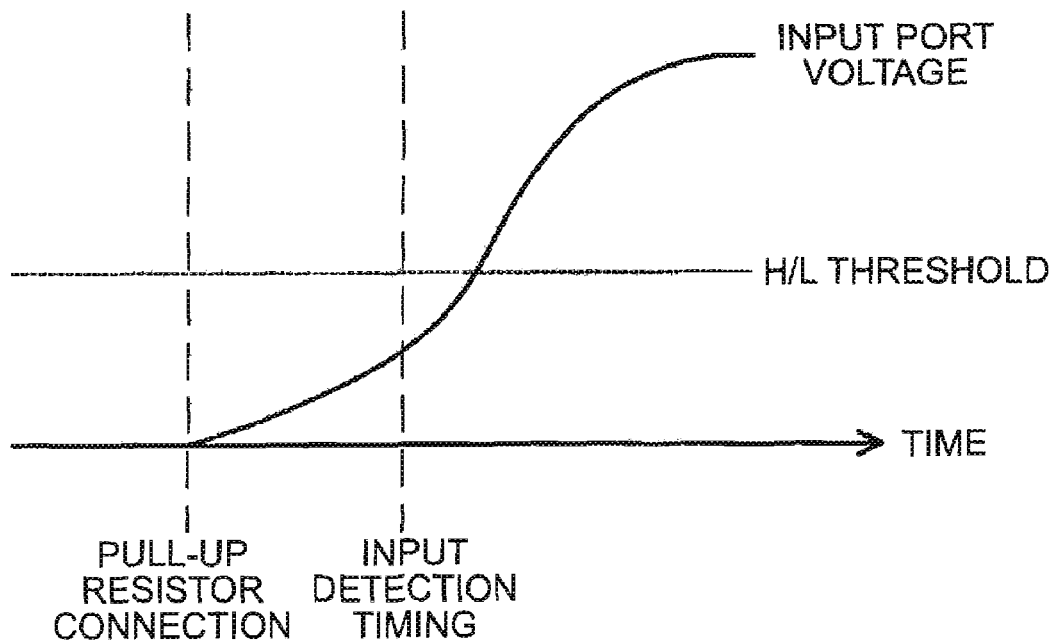

Operation of the external signal detection circuit 10 will next be described. FIG. 2 is a typical operation timing chart. On receipt of a setting signal from an external environment, the register setting portion 44 produces an output of "0" or "1" as a selection signal for the first switch portion 24 and the second switch portion 34. Specifically, the register setting portion 44 outputs a "0" if the pull-up resistor 22 is to be connected to the input port 12. Alternatively, the register setting portion 44 outputs a "1" if the pull-down resistor 32 is to be connected to the input port 12. The selection signal to be outputted to the first switch portion 24 is first inverted by the first inverter 48, and then inputted to the first AND circuit 46. The selection signal to be outputted to the second switch portion 34 is inputted to the second AND circuit 49.

Further, receiving a setting signal from an external environment, the register setting portion 44 make a setting so that an oscillation signal at an arbitrary frequency is applied to the input port detection sync selector 40 and the resistor control sync selector 42. Receiving the setting signal from the external environment, the register setting portion 44 also sets an initial value of each of the setup time counter 54 and the release time counter 56. It is to be noted that, in FIG. 2, an initial value of "8" is set for the release time counter 56 and an initial value of "5" is set for the setup time counter 54.

The oscillator circuit 76 oscillates the piezoelectric device 74 and thereby produces an output of a source oscillation at a predetermined frequency. On receipt of the input of the source oscillation, the divider portion 80 uses the ½ divider circuit 82 to divide the source oscillation and then produces an output of an oscillation signal. Oscillation signals at frequencies set by the register setting portion 44 are inputted to the input port detection sync selector 40 and the resistor control sync selector 42. The oscillation signals inputted to these sync selectors 40, 42 may have different frequencies from each other; however, the oscillation signals inputted to the sync selectors 40, 42 are based on the source oscillation outputted from the oscillator portion 72 and accordingly the oscillation signals are in synchronism with each other. The input port detection sync selector 40 produces an output of the input detection signal based on the oscillation signal inputted thereto. The resistor control sync selector 42, on the other hand, produces an output of the control clock signal based on the oscillation signal inputted thereto. It should be noted herein that the input detection signal and the control clock signal are in synchronism with each other, since the oscillation signals inputted to the two sync selectors 40, 42 are in synchronism with each other.

The input detection signal is applied to the input detection portion 14 so that the external signal detection timing can be set. The input detection signal is also inputted to the release time counter 56 and the setup time counter 54. The control clock signal is, on the other hand, applied to the release time counter 56 and the setup time counter 54 of the counter portion 52. The input detection signal applied to each of the counters 54, 56 controls loading of the initial value set in each of the counters 54, 56. The input detection signal clears a count of each of the counters 54, 56 at a timing indicated by a dotted line A in FIG. 2, thereby loading the initial value.

When the initial value is loaded, the release time counter 56 starts counting with this initial value. In the case shown in FIG. 2, the release time counter 56 starts counting with the initial value of "8." Counting takes place according to the control clock signal applied and, when the counter 56 counts "0," an overflow signal is outputted. The overflow signal is synchronized with the input detection signal. The overflow signal is then applied to the second inverter 64 and inverted before being outputted to the OR circuit 62. With the initial loaded, the setup time counter 54 starts counting with the initial value. In the case shown in FIG. 2, the setup time counter 54 starts counting with the initial value of "5." Counting takes place according to the control clock signal applied and, when the counter 54 counts "0," an overflow signal is outputted. The overflow signal is synchronized with the input detection signal. The overflow signal is outputted to the OR circuit 62.

The overflow signals outputted from the counters 54, 56 are logically ORed with each other by the OR circuit 62 to produce an output of a connection control signal to the first switch portion 24 and the second switch portion 34. The connection control signal, being in synchronism with the input detection signal, turns on the switch portions 24, 34 in time with the input detection signal. Specifically, the connection control signal functions to connect the pull-up resistor 22 or the pull-down resistor 32 to the input port 12 in time with the detection timing of the external signal. The selection signal and the connection control signal are logically ANDed with each other by the first AND circuit 46 and the second AND circuit 49 as the signals are applied thereto. The results of the logical operations are applied, respectively, to the first switch portion 24 and the second switch portion 34, which achieves on/off control of each of the switch portions 24, 34. The period of time, through which the switch portions 24, 34 are kept on or off is set by the initial values of the release time counter 56 and the setup time counter 54. Specifically, changing the initial value set for the release time counter 56 varies the connection time of the switch portions 24, 34 after the detection timing. Changing the initial value set for the setup time counter 54 varies the connection time of the switch portions 24, 34 before the detection timing.

More specifically, to turn on the first switch portion 24, a "0" is outputted as the selection signal from the register setting portion 44. This selection signal is inverted by the first inverter 48 to become a "1" which, in turn, is applied to the first AND circuit 46 and the second AND circuit 49. The connection control portion 50 produces an output of the connection control signal of "1" so that the switch portions 24, 34 are closed according to the detection timing, and of the connection control signal of "0" so that the switch portions 24, 34 are open at other timings. The first AND circuit 46 receives inputs of the selection signal of "1" and the connection control signal of "1" for a range corresponding to the detection timing and outputs a "1" to, and thereby turns on, the first switch portion 24 for a period of time, during which the pull-up resistor 22 is to be connected to the input port 12. Similarly, the first AND circuit 46 receives inputs of the selection signal of "1" and the connection control signal of "0" for a range other than that corresponding to the detection timing and outputs a "0" to, and thereby turns off, the first switch portion 24 for a period of time, during which the pull-up resistor 22 is to be disconnected from the input port 12. The second AND circuit 49, on the other hand, receives inputs of the selection signal of "0" and the connection control signal of "0" or "1" and outputs a "0" to, and thereby turns off, the second switch portion 34 for a range corresponding to the detection timing and other timings.

When the pull-up resistor 22 or the pull-down resistor 32 is connected to the input port 12 in time with the detection timing of the external signal as described heretofore, the external signal is applied to the input detection portion 14 via the input port 12 and the signal line 16. The input detection portion 14 determines whether or not the external signal is applied in accordance with the detection timing set by the input detection signal. Detection of the external signal is determined based on the external signal and the input detection signal. The input detection portion 14 outputs the results of this detection to an electronic circuit (not shown) including a CPU, an arithmetic circuit, and the like.

As described in the foregoing, the external signal detection circuit 10 and the real-time clock 70 having therein the external signal detection circuit 10 include the input port 12, to which the pull-up resistor 22 and the pull-down resistor 32 are connected and, by connecting either one of the resistors 22, 32 to the input port 12, detect the external signal. Either one of the resistors 22, 32 is connected to the input port 12 according to the input detection signal applied to the input detection portion 14. Specifically, the pull-up resistor 22 or the pull-down resistor 32 is connected to the input port 12 intermittently in time with the timing, at which the external signal is detected by the input detection portion 14. The power source Vdd is therefore connected to the input port 12 only when the pull-up resistor 22 is connected to the input port 12. At any time other than this, i.e., at any time other than the detection timing, there is no chance that a wasteful current will flow from the power source Vdd to the external circuit connected to the input port 12. Consequently, low power consumption can be promoted. If the real-time clock 70 is driven by a battery, the service life of the battery can be elongated.

Further, the connection of the pull-up resistor 22 or the pull-down resistor 32 to the input port 12 is continuously controlled based on the oscillation signal outputted from the timing signal output portion 71 of the real-time clock 70. This allows, in the external signal detection circuit 10 according to the embodiment of the invention, the pull-up resistor 22 or the pull-down resistor 32 to be connected to the input port 12 without using any software or external circuit as in related art.

As a result, load on the CPU or the system can be lessened and power consumption of the CPU itself can be reduced.

A detection cycle of the external signal applied to the input port 12 and the timing, at which the pull-up resistor 22 or the pull-down resistor 32 is intermittently connected to the input port 12, can be arbitrarily set. This allows the connection time of the pull-up resistor 22 or the pull-down resistor 32 to be established according to characteristics of the external signal. It should be noted herein that the input detection signal and the control clock signal are based on the source oscillation outputted from the identical oscillator portion 72. These signals can therefore be synchronized with each other. Since the timing, at which the pull-up resistor 22 or the pull-down resistor 32 is connected to the input port 12, is based on the source oscillation of the oscillator portion 72, therefore, control that is phase-synchronized with the detection timing can be provided. If a crystal oscillator is used for the piezoelectric device 74, the connection timing of the resistor 22, 32 and the detection timing can be phase-synchronized with greater accuracy. Control of high accuracy can therefore be achieved.

When a HIGH signal (external signal) applied to the input port 12 is to be detected by connecting the pull-up resistor 22 to the input port 12, a large line capacity of the external circuit contributes to a longer time in voltage buildup at the input port 12. In the external signal detection circuit 10 according to the embodiment of the invention, however, the timing at which the pull-up resistor 22 or the pull-down resistor 32 is connected to the input port 12 can be advanced by changing the initial value of the counter portion 52. This helps prevent false signal detection from occurring. Being based on the oscillation signal, this adjustment of advancing the timing can be made with high accuracy.

The timing at which the pull-up resistor 22 or the pull-down resistor 32 is connected to the input port 12 is stored, for example, in an internal register of the real-time clock 70. Since the real-time clock 70 is driven by a backup secondary battery or the like, therefore, it is possible to detect an input of an external signal of a switch or the like immediately after system power has been recovered from shutdown. Similarly, the real-time clock 70 is capable of notifying the CPU of an interruption by detecting an external signal of high priority, such as an emergency input or the like, during a sleep mode (a power saving mode) of the system.

The external signal detection circuit 10 having arrangements as described heretofore may be mounted in not only the real-time clock 70, but also an electronic component including the timing signal output portion 71 for use in detection of external signals.

The external signal detection circuit 10 may even be configured so as to have only the pull-up circuit 20 connected to the input port 12.

The entire disclosure of Japanese Patent Application No. 2005-214095, filed Jul. 25, 2005 is expressly incorporated by reference herein.

What is claimed is:

1. An external signal detection circuit, comprising:
   an input port, to which a first end of a circuit including a pull-up resistor connected in series with a first switch portion and a second end of a circuit including a pull-down resistor connected in series with a second switch portion are connected, the input port receiving an input of an external signal;
   an input detection portion connected to the input port for receiving an input of the external signal and an input of an input detection signal that sets a timing for intermittently detecting the input of the external signal;
   a register setting portion connected to the first switch portion and the second switch portion, the register setting portion selecting either one of the first and second switch portions; and
   a connection control portion connected to the first switch portion and the second switch portion, the connection control portion controlling a connection time of either the first switch portion or the second switch portion, whichever is selected by the register setting portion based on an input detection signal detecting an input of the external signal to the input port and a control clock signal in synchronism with the input detection signal.

2. The external signal detection circuit according to claim 1, wherein the connection control portion includes:
   a counter portion receiving an input of the input detection signal and the control clock signal in synchronism with the input detection signal, the counter portion setting a connection time of the first switch portion or the second switch portion, whichever is selected by the register setting portion; and
   an arithmetic portion connected to the counter portion, the arithmetic portion calculating a signal outputted from the counter portion and outputting a result of calculation to the first switch portion and the second switch portion.

3. An external signal detection circuit, comprising:
   an input port, to which a first end of a circuit including a pull-up resistor connected in series with a first switch portion and a second end of a circuit including a pull-down resistor connected in series with a second switch portion are connected, the input port receiving an input of an external signal;
   a register setting portion connected to the first switch portion and the second switch portion, the register setting portion selecting either one of the first and second switch portions; and
   a connection control portion connected to the first switch portion and the second switch portion, the connection control portion controlling a connection time of either the first switch portion or the second switch portion, whichever is selected by the register setting portion based on an input detection signal detecting an input of the external signal to the input port and a control clock signal in synchronism with the input detection signal.

4. The external signal detection circuit according to claim 3, wherein the connection control portion includes:
   a setup time counter receiving an input of the input detection signal and the control clock signal and thereby setting a connection time before a detection timing established based on the input detection signal;
   a release time counter receiving an input of the input detection signal and the control clock signal and thereby setting a connection time after the detection timing; and
   an arithmetic portion connected to the setup time counter and the release time counter, the arithmetic portion calculating signals outputted from the setup and release time counters and outputting a result of calculation to the first or second switch portion so that the switch portion is connected in time with the detection timing.

5. An external signal detection circuit comprising:
   an input port, to which a first end of a circuit including a pull-up resistor connected in series with a first switch portion is connected, the input port receiving an input of an external signal;
   an input detection portion connected to the input port for receiving an input of the external signal and an input of an input detection signal that sets a timing for intermittently detecting the input of the external signal;

a connection control portion turning on the first switch portion in time with the timing at which the external signal is detected, the connection control portion including:
  a counter portion receiving an input of the input detection signal and a control clock signal in synchronism with the input detection signal, the counter portion setting a connection time of the first switch portion; and
  an arithmetic portion connected to the counter portion, the arithmetic portion calculating a signal outputted from the counter portion and outputting a result of calculation to the first switch portion;
an input port detection sync selector producing an output of the input detection signal based on an oscillation signal at a predetermined frequency; and
a resistor control sync selector producing the control clock signal based on the oscillation signal.

6. A real-time clock, comprising:
the external signal detection circuit according to claim 1; and
a timing signal output portion producing an output of a timing clock signal.

7. The real-time clock according to claim 6, wherein the timing signal output portion includes an oscillator portion and a divider portion producing an output of an oscillation signal by dividing a source oscillation outputted from the oscillator portion.

* * * * *